(12) United States Patent
Oomori et al.

(10) Patent No.: US 9,048,699 B2
(45) Date of Patent: Jun. 2, 2015

(54) POWER TOOL

(75) Inventors: Katsuhiro Oomori, Hitachinaka (JP);
Junichi Toukairin, Hitachinaka (JP);
Nobuhiro Takano, Hitachinaka (JP);
Kazutaka Iwata, Hitachinaka (JP);
Tomomasa Nishikawa, Hitachinaka (JP)

(73) Assignee: HITACHI KOKI CO., LTD., Tokyo (JP)

( * ) Notice: Subject to any disclaimer, the term of this patent is extended or adjusted under 35 U.S.C. 154(b) by 741 days.

(21) Appl. No.: 13/121,169

(22) PCT Filed: May 20, 2009

(86) PCT No.: PCT/JP2009/059643
§ 371 (c)(1),
(2), (4) Date: Jun. 7, 2011

(87) PCT Pub. No.: WO2010/035547
PCT Pub. Date: Apr. 1, 2010

(65) Prior Publication Data
US 2011/0227430 A1 Sep. 22, 2011

(30) Foreign Application Priority Data

Sep. 29, 2008 (JP) .................................. 2008-250356
Feb. 24, 2009 (JP) .................................. 2009-041419

(51) Int. Cl.
*H02K 5/20* (2006.01)
*H02K 9/06* (2006.01)
(Continued)

(52) U.S. Cl.
CPC .. *H02K 9/06* (2013.01); *B25F 5/00* (2013.01); *H02K 7/145* (2013.01);
(Continued)

(58) Field of Classification Search
CPC ............. H02K 5/20; H02K 9/06; B25F 5/008
USPC ....... 310/50, 52, 60 A, 89, 68 R, 58; 173/217
See application file for complete search history.

(56) References Cited

U.S. PATENT DOCUMENTS 3,748,509 A 7/1973 Karcher
3,803,758 A 4/1974 Chang et al.
(Continued)

FOREIGN PATENT DOCUMENTS

DE 2155341 A1 7/1972
DE 8007170 U1 10/1980
(Continued)

OTHER PUBLICATIONS

Japan Patent Office office action for JPO patent application JP2009-041419 (Jun. 3, 2013).
(Continued)

*Primary Examiner* — Burton Mullins
(74) *Attorney, Agent, or Firm* — Kilpatrick Townsend & Stockton LLP

(57) ABSTRACT

According to an aspect of the present invention, there is provided a power tool including: a brushless motor; switching elements that drive the brushless motor; a circuit board on which the switching elements are mounted; a transmission portion that transmits a driving force of the brushless motor; and a housing that houses the brushless motor, the switching elements, the circuit board and the transmission portion therein, wherein the switching elements include semiconductor elements each having terminals on a bottom surface thereof, and wherein the switching elements are surface mounted on the circuit board.

11 Claims, 16 Drawing Sheets

(51) Int. Cl.
  *B25F 5/00*        (2006.01)
  *H05K 1/18*        (2006.01)
  *H02K 7/14*            (2006.01)
  *H02K 11/00*           (2006.01)
  *H05K 3/34*            (2006.01)

(52) U.S. Cl.
  CPC ....... *H02K 11/0021* (2013.01); *H02K 11/0073*
  (2013.01); *H05K 1/181* (2013.01); *H05K 3/341*
  (2013.01); *H05K 2201/09027* (2013.01); *H05K*
  *2201/10166* (2013.01); *H01L 2924/0002*
  (2013.01)

(56) References Cited

U.S. PATENT DOCUMENTS

| | | | |
|---|---|---|---|
| 5,386,885 A | | 2/1995 | Bunzl et al. |
| 5,789,829 A | | 8/1998 | Heesemann |
| 6,144,121 A | * | 11/2000 | Ishida et al. .................... 310/50 |
| 6,779,612 B2 | * | 8/2004 | Nishikawa et al. ........... 173/217 |
| 6,949,849 B1 | * | 9/2005 | Wright et al. ................... 310/89 |
| 6,971,456 B2 | * | 12/2005 | Yamada et al. ............... 173/217 |
| 7,064,462 B2 | * | 6/2006 | Hempe et al. ................... 310/50 |
| 7,166,939 B2 | * | 1/2007 | Voigt et al. ..................... 310/47 |
| 7,220,617 B2 | * | 5/2007 | Kagii et al. ..................... 438/106 |
| 7,330,006 B2 | * | 2/2008 | Iwata et al. .............. 318/400.41 |
| 7,832,499 B2 | * | 11/2010 | Komuro et al. ............... 173/217 |
| 2005/0127532 A1 | | 6/2005 | Luo et al. |
| 2006/0255756 A1 | | 11/2006 | Iwata et al. |
| 2006/0261689 A1 | | 11/2006 | Natsuhara |
| 2007/0046111 A1 | * | 3/2007 | Lagier et al. .................... 310/58 |
| 2008/0290745 A1 | * | 11/2008 | Riedl .............................. 310/50 |

FOREIGN PATENT DOCUMENTS

| | | | | |
|---|---|---|---|---|
| DE | 8805185 U1 | | 8/1989 | |
| DE | 9006935 U1 | | 10/1991 | |
| DE | 9017681 U1 | | 11/1991 | |
| DE | 4131966 A1 | | 4/1992 | |
| DE | 4121545 A1 | | 1/1993 | |
| DE | 4315404 A1 | | 11/1994 | |
| DE | 19543284 | * | 6/1997 | ............... H02K 9/06 |
| EP | 0 697 759 A1 | | 2/1996 | |
| EP | 1 715 565 A1 | | 10/2006 | |
| JP | 2002-519986 A | | 7/2002 | |
| JP | 2004-357371 A | | 12/2004 | |
| JP | 2006-60889 A | | 3/2006 | |
| JP | 2006-222298 A | | 8/2006 | |
| JP | 2006-297532 A | | 11/2006 | |
| JP | 2007-15045 A | | 1/2007 | |
| JP | 2007-196363 A | | 8/2007 | |
| JP | 2008-187798 A | | 8/2008 | |
| JP | 2008-272870 A | | 11/2008 | |
| JP | 2008-272871 A | | 11/2008 | |
| JP | 2009-72867 | * | 4/2009 | ............... B25F 5/00 |
| WO | WO00/01054 A1 | | 1/2000 | |

OTHER PUBLICATIONS

Japan Patent Office office action for JPO patent application JP2009-041419 (Oct. 25, 2013).

* cited by examiner

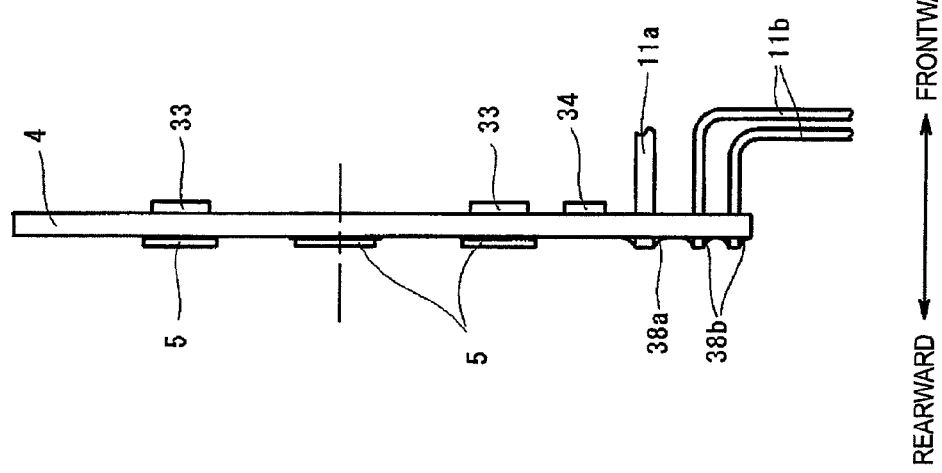
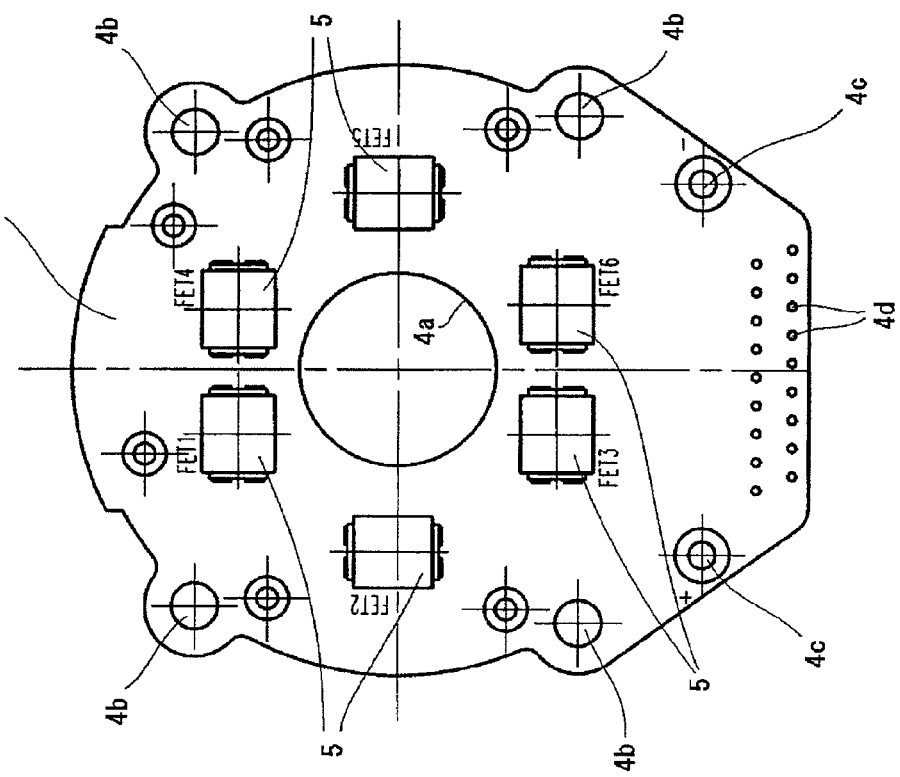

POWER TOOL

This application is a U.S. National Stage of International Application No. PCT/JP2009/059643 filed May 20, 2009, and which claims the benefit of Japanese Patent Applications Nos. 2008-250356, filed Sep. 29, 2008 and 2009-041419, filed Feb. 24, 2009 the entireties of which are incorporated by reference herein.

TECHNICAL FIELD

An aspect of the present invention relates to a power tool using a brushless motor and, in particular, relates to a power tool having an improved structure for attaching switching elements that are mounted on the inverter circuit board of the brushless motor.

BACKGROUND ART

In recent years, in a power tool for rotating and driving a tip end tool such as a drill or a driver by using a motor to perform a required operation, a brushless motor has been employed. The brushless motor is a DC motor having no brush (rectifying brush), for example, and employs coils (windings) on a stator side and a permanent magnet on a rotor side, whereby a power driven by an inverter is sequentially supplied to the predetermined coils to rotate the rotor. In the brushless motor, switching elements for selectively supplying the currents to the coils wound around the stator are disposed on a circuit board located near the motor. In JP-2004-357371-A, for example, switching elements are disposed on a circuit board of an almost circular shape attached to the rear side (a side in opposite to the tip end tool side) of a motor.

Conventionally, in a method of mounting switching elements on the rear side of a circuit board, the switching elements are disposed so that the height direction of the switching elements is in parallel to the rotation shaft of the motor in view of the cooling and the mounting space. However, according to such the arrangement, although the good performance can be realized in view of the cooling, it is required to provide a space corresponding to the height of the circuit board and the switching elements on the rear side in the axial direction of the motor. Further, conventionally, the switching elements are fixed on the board so that through holes are formed at the circuit board, then leg portions of the switching elements are passed through the through holes and the leg portions are fixed by the soldering from the rear side thereof. Thus, in the power tool shown in JP-2004-357371-A, since the switching elements are provided so that the longitudinal direction thereof becomes almost orthogonal to the circuit board, the length of a housing in its longitudinal direction becomes long when the brushless motor is applied to the power tool.

On the other hand, it is considered to provide the circuit board at another position in place of the rear side of the motor in order to avoid that the length of the housing in its longitudinal direction becomes long. However, in this case, a wiring for coupling the coils of the motor with the switching elements becomes long and further it is difficult to dispose the board at another position in view of heat dissipation of the switching elements which likely generate heat.

SUMMARY OF INVENTION

An object of the invention is to provide a power tool in which the shape of each of switching elements of a brushless motor is changed and an attachment method of the switching elements is improved.

Another object of the invention is to provide a power tool using a brushless motor, in which a housing for containing the motor therein is made small According to an aspect of the present invention, there is provided a power tool including: a brushless motor; switching elements that drive the brushless motor; a circuit board on which the switching elements are mounted; a transmission portion that transmits a driving force of the brushless motor; and a housing that houses the brushless motor, the switching elements, the circuit board and the transmission portion therein, wherein the switching elements include semiconductor elements each having terminals on a bottom surface thereof, and wherein the switching elements are surface mounted on the circuit board.

According to another aspect of the present invention, there may be provided the power tool, wherein each of the switching elements has: a metal case that is formed in a substantially flat rectangular shape and that covers a corresponding one of the semiconductor elements; and drain terminals that are respectively formed on lower portions of opposing two sides of the metal case, and wherein each of the drain terminals is surface-mounted on the circuit board through a solder portion.

According to still another aspect of the present invention, there may be provided the power tool, wherein the circuit board is positioned on a rear surface side of the brushless motor so as to orient a vertical direction with respect to a rotation shaft of the brushless motor.

According to still another aspect of the present invention, there may be provided the power tool, wherein the six switching elements are fixed on one surface of the circuit board, the other surface of the circuit board facing the motor.

According to still another aspect of the present invention, there may be provided the power tool, wherein each of the drain terminal is fixed to the circuit board at two partial areas thereof, the two partial areas being separated from each other, the solder portion being provided on each of the two partial areas.

According to still another aspect of the present invention, there may be provided the power tool, wherein each of the six switching elements is disposed on the circuit board so that the other two sides of the metal case at which the drain terminal is not provided become substantially parallel to a circumferential direction around the rotation shaft.

According to still another aspect of the present invention, there may be provided the power tool, wherein the six switching elements are surface mounted on a surface of the circuit board, and wherein a resin is coated on the surface of the circuit board so as to cover the switching elements.

According to still another aspect of the present invention, there may be provided the power tool, wherein the housing includes: a body portion that houses the brushless motor and the transmission portion therein; and a grip portion that extends from the body portion so as to be substantially orthogonal thereto, and wherein the circuit board is provided at the body portion.

According to still another aspect of the present invention, there may be provided the power tool, wherein the circuit board has a hole to pass a rotation shaft of the brushless motor therethrough and is disposed so as to be substantially orthogonal to the rotation shaft, wherein the semiconductor elements housed in a resin casing are used as the switching elements, respectively, wherein the switching elements are disposed around the hole of the circuit board in a transversely-laid state, wherein at least part of the switching elements are disposed so that longitudinal directions thereof become substantially parallel with one another, and wherein the other switching elements are disposed so that longitudinal directions thereof are inclined with respect to the longitudinal directions of the part of the switching elements.

According to still another aspect of the present invention, there may be provided the power tool, wherein the part of the switching elements are disposed so that the longitudinal directions thereof are aligned substantially on the same line.

According to still another aspect of the present invention, there may be provided the power tool, wherein each of the switching elements includes: a first terminal that is provided at a bottom surface of the resin casing so as to be coupled to the circuit board; and a second terminal that extends from a side surface of the resin casing toward the circuit board so as to be coupled to the circuit board.

Since the semiconductor element having the terminals on the bottom surface thereof is used as each of the switching elements and the switching elements are fixed on the circuit board in the surface mounting manner, the space required for the elements mounted on the circuit board can be reduced to a large extent. Thus, the power tool can be realized in which the size on the rear end side of the motor in the body portion of the housing of the power tool is made small and so the entire length of the power tool is short.

Each of the semiconductor elements is housed in the metal casing of the flat and almost rectangular shape, the drain terminals thereof are respectively formed at the lower portions of the two opposed sides each having the almost rectangular shape of the metal casing, and each of the drain terminals is surface-mounted by soldering at partial areas thereof. Thus, since the semiconductor elements can be stably mounted on the circuit board and are unlikely exfoliated by the vibration, the power tool with excellent reliability can be provided.

The circuit board is fixed on the rear surface side of the brushless motor along the vertical direction with respect to the rotation shaft of the brushless motor. Thus, the cooling wind for the motor can also be used for cooling the circuit board and the body portion of the housing can be made short, so that the workability of the power tool is less deteriorated.

The six switching elements are fixed on the surface of the circuit board in opposite to the other surface facing the motor. Thus, since the cooling air taken from the outside of the housing is directly applied to the switching elements, the good cooling structure can be realized.

The two partial areas separated to each other of each of the drain terminals are soldered in the surface mounting manner. Thus, this configuration can cope with a fact that a non-uniform stress is applied to the surface area of the elongated drain terminal due to the heat, whereby the solder is unlikely exfoliated and so the stable fixing can be realized.

Each of the six switching elements is disposed on the circuit board so that the two sides having no drain terminal are almost in parallel to the circumferential direction around the rotation shaft. Thus, even in a case where a strong impact is applied in the circumferential direction in an impact type tool etc., the strong fixing can be realized with respect to the direction of the impact.

The resin is coated on the surface of the circuit board so as to cover the switching elements thus surface-mounted. Thus, since the heat generated from the switching elements is transmitted to and spread over the resin, the heat is dissipated by the resin with a large area, so that good cooling effects can be obtained.

The housing includes the body portion which houses the brushless motor and the transmission portion therein and the grip portion which extends from the body portion so as to be almost orthogonal thereto, and the circuit board is provided at the body portion. Thus, the entire length and the diameter of the body portion can be made small.

The circuit board has the hole for passing the rotation shaft of the brushless motor therethrough and is provided so as to be almost orthogonal to the rotation shaft, the semiconductor elements housed in the resin casing are used as the switching elements, respectively, the switching elements are disposed at the periphery of the hole of the circuit board in a state of being laid transversely, and plural ones of the switching elements are disposed so that the longitudinal directions thereof are almost in parallel from one another or aligned on the same line, and the longitudinal directions of remaining ones of the switching elements are inclined with respect to the longitudinal directions of the plural ones of the switching elements. Thus, since the switching elements can be mounted effectively in the limited area, the entire length and the size of the power tool can be made small. Further, since a part of the switching elements is (are) disposed so as to be inclined, the size of the hole formed at the center of the circuit board can be made large.

Each of the switching elements includes the first terminal which is provided at the bottom surface of the resin casing and coupled to the circuit board and the second terminal which extends from the side surface of the resin casing to the circuit board and is coupled to the circuit board. Thus, an FET having a large capacity etc. can be surface mounted.

The aforesaid and other objects and new features of the invention will be apparent from the specification and drawing explained below.

BRIEF DESCRIPTION OF DRAWINGS

FIGS. 5A and 5B are diagrams showing an inverter circuit board of FIG. 1, wherein FIG. 5A is a rear view of the impact driver and FIG. 5B is a side view thereof.

FIGS. 6A and 6B are diagrams showing the shape of a switching element 5 of FIG. 1, wherein FIG. 6A is a top view of the switching element 5 and FIG. 6B is a sectional view along a A-A portion of FIG. 6A.

DESCRIPTION OF EMBODIMENTS

Figure 1:
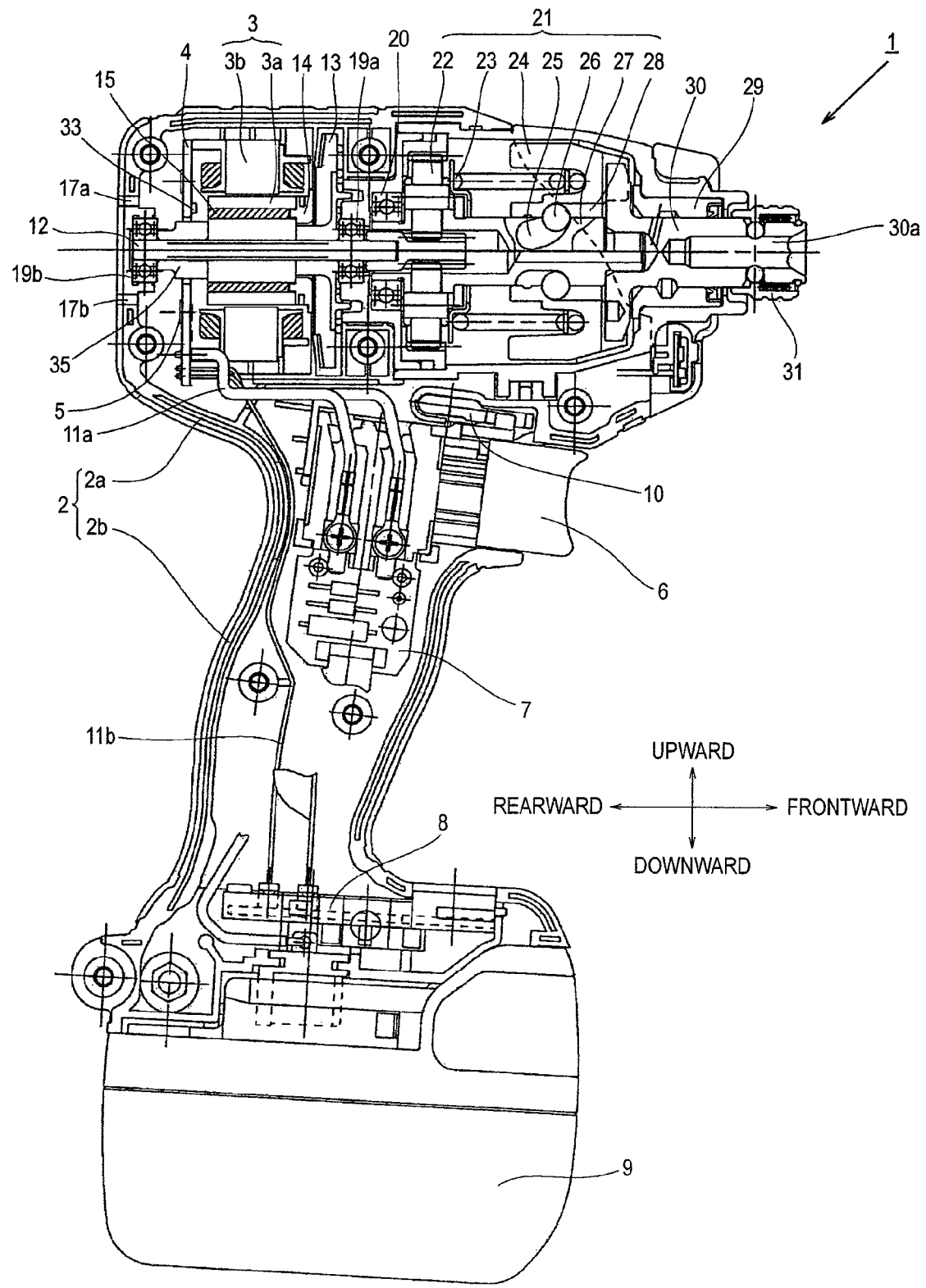
FIG. 1 is a sectional diagram showing the inner structure of an impact driver according to a first embodiment of the invention.

Hereinafter, embodiments according to the invention will be explained based on drawings. In the following explanation, the upper, lower, front and rear directions coincide with the respective directions shown in FIG. 1 except for FIGS. 6A and 6B. FIG. 1 is a diagram showing the inner structure of an impact driver 1 according to a first embodiment of the power tool of the invention. The impact driver 1 drives a rotary switching mechanism 21 based on a chargeable battery 9 acting as a power supply and a motor 3 acting as a driving source to apply a rotation power and a striking power to an anvil 30 acting as an output shaft to thereby intermittently apply a rotary striking force to a not-shown tip end tool such as a driver bit held by an attachment hole 30a covered by a sleeve 31, whereby a processing such as a screw fastening or a bolt fastening is performed.

The brushless DC type motor 3 is housed within the cylindrical body portion 2a of a housing 2. The rotation shaft 12 of the motor 3 is rotatably held by a bearing 19a provided near the center portion of the body portion 2a of the housing 2 and a bearing 19b on the rear end side. On the front side of the motor 3, a rotor fan 13 is provided which is attached coaxially with the rotation shaft 12 and rotates in synchronism with the motor 3. On the rear side of the motor 3, an inverter circuit board 4 for driving the motor 3 is disposed. An air flow caused by a rotor fan 13 is taken into the body portion 2a from air intake ports 17a, 17b and slits (slits 16a in FIG. 2 and slits 16b in FIG. 3) described later formed at a housing portion at the periphery of the inverter circuit board 4, then flows mainly so as to pass between a rotor 3a and a stator 3b, then is sucked from the rear side of the rotor fan 13 and flows in the radial direction of the rotor fan 13, and is exhausted to the outside of the housing 2 from slits (slits 18a, 18b in FIG. 2 and slits 18c, 18d in FIG. 3) described later formed at a housing portion at the periphery of the rotor fan 13. The inverter circuit board 4 is a double-sided board having an almost circular shape which is almost same as the contour of the motor 3. A plurality of switching elements 5 such as FETs (Field Effect Transistors) and position detecting elements 33 such as Hall ICs are mounted on the board.

Figure 4:
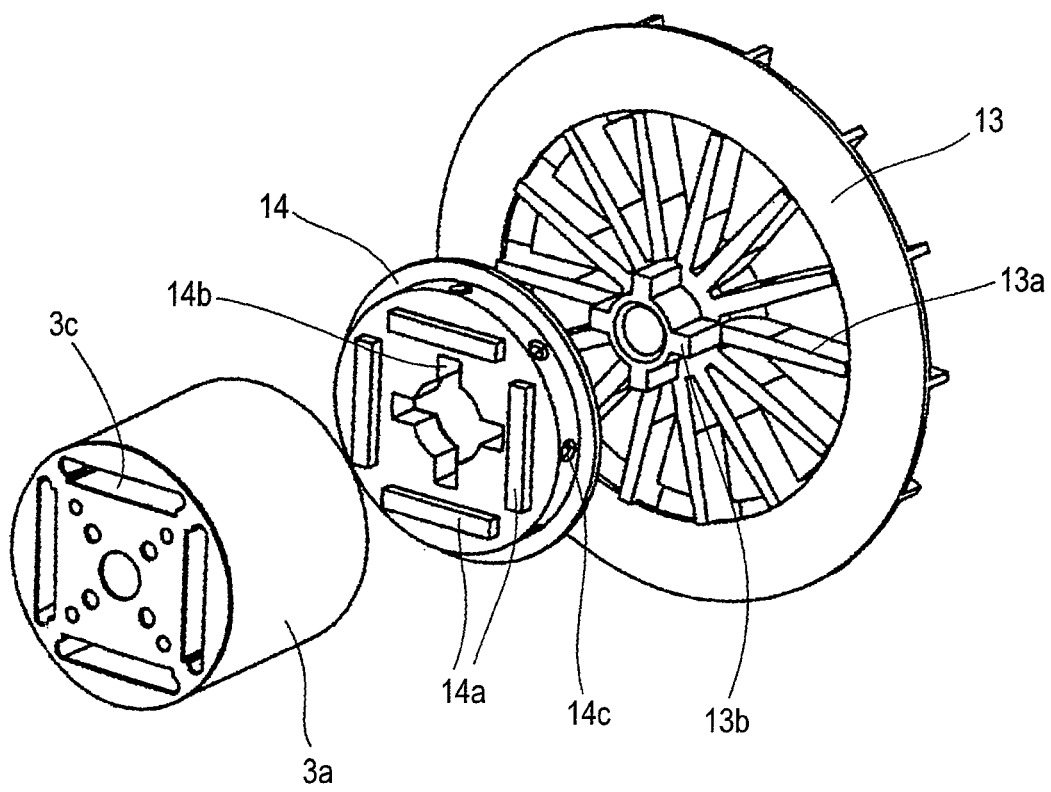
FIG. 4 is a perspective view showing the shapes of a rotor 3a, a sleeve 4 and a rotor fan 13 of FIG. 1.

A sleeve 14 and the rotor fan 13 are attached coaxially with the rotation shaft 12 between the rotor 3a and the bearing 19a. The relation of these elements is shown in FIG. 4. The rotor 3a forms a magnetic path formed by a magnet 15 and is configured by laminating thin metal plates each having four flat slits 3c, for example. As clear from the sectional diagram of FIG. 1, the magnet 15 is slightly shorter than the axial length of the rotor 3a and so the magnet 15 does not reach the end portion of the rotor 3a on the side where a sleeve 14 contacts. Thus, each of the slits 3c is configured as if a groove is formed.

The sleeve 14 is provided with four whirl-stop ribs 14a (convex portions) and also provided with a whirl-stop hole 14b (concave portion) formed in a cross shape. The sleeve 14 may be formed by plastics or metal. In this case, the sleeve is preferably formed by nonmagnetic material so as not to influence on the magnetic path of the rotor 3a. Grooves 14c for correcting an unbalanced state is formed at the outer periphery of the sleeve 14 as the need arises.

The rotor fan 13 is integrally formed by molding plastics, for example, and is provided with four whirl-stop ribs 13b protruding backward so as to be disposed in an almost cross shape. The whirl-stop ribs 13b are respectively fit into the whirl-stop ribs 14a explained with reference to FIG. 4. The rotor fan 13 acts as a so-called centrifugal fan which sucks the air from the inner peripheral side in the rear direction and exhausts the air to the outside in the radial direction on the front side. The rotor fan has a plurality of blades 13b extending radially from the periphery of a through hole in which the rotation shaft 12 passes.

Again in FIG. 1, a spacer 35 made of plastics is provided between the rotor 3a and the bearing 19b. The spacer 35 has an almost cylindrical shape and sets a distance between the bearing 18 and the rotor 3a. This distance is required for disposing the circuit 4 (FIG. 1) coaxially and for forming a space necessary as a flow path of the air for cooling the switching elements 5.

A trigger switch 6 is disposed at the upper portion within a handle portion 2b integrally extending in an almost orthogonal direction from the body portion 2a of the housing 2. A switch board 7 is provided beneath the trigger switch 6. A control circuit board 8 having a function of controlling the speed of the motor 3 in accordance with the pulling operation of the trigger switch 6 is housed at the lower portion within the handle portion 2b. The control circuit board 8 is coupled to the inverter circuit board 4 via signal lines 11b. The battery 9 such as a nickel-cadmium battery or a lithium ion battery is attached so as to be detachable beneath the handle portion 2b.

The rotary switching mechanism 21 includes a planet gear reduction mechanism 22, a spindle 27 and a hummer 24, and is held at its rear end by a bearing 20 and at its front end by a metal 29. When the motor 3 is started by pulling the trigger switch 6, the motor 3 starts to rotate in the direction set by a forward/reverse rotation switch lever 10. The rotation speed of the motor is decelerated by the planet gear reduction mechanism 22 and the rotation force is transmitted to the spindle 27, whereby the spindle 27 rotates at a predetermined speed. The spindle 27 and the hummer 24 is coupled via a cam mechanism. The cam mechanism is configured by a spindle cam groove 25 of a V-shape formed at the outer peripheral surface of the spindle 27, a hummer cam groove 28 formed at the inner peripheral surface of the hummer 24 and a ball 26 engaging with these cam grooves 25, 28.

The hummer 24 is always biased in the front direction by a spring 23. In the stationary state, the hummer locates at a position spaced from the end surface of the anvil 30 due to the engagement of the ball 26 and the cam grooves 25, 28. Not-shown convex portions are formed in a symmetrical manner at two portions on opposing rotary planes of the hummer 24 and the anvil 30.

When the spindle 27 is rotated, the rotation force is transmitted to the hummer 24 via the cam mechanism. Before the hummer 24 performs a half-turn, the convex portion of the hummer 24 engages with the convex portion of the anvil 30 to rotate the anvil 30. Due to the reaction force caused by the engagement at this time, a relative rotation occurs between the spindle 27 and the hummer 24, whereby the hummer 24 starts to move backward on the motor 3 side along the spindle cam groove 25 of the cam mechanism while compressing the spring 23.

When the convex portion of the hummer 24 moves over the convex portion of the anvil 30 to release the engagement relation therebetween due to the backward movement of the hummer 24, the hummer 24 moves in the front direction by the biasing force of the spring 23 while being rapidly accelerated in the rotation direction and the forward direction due to the elastic energy accumulated in the spring 23 and the action of the cam mechanism in addition to the rotation force of the spindle 27. Thus, the convex portion of the hummer engages with the convex portion of the anvil 30 again and so the hummer starts to rotate integrally with the anvil. In this case, since a strong rotary striking force is applied to the anvil 30, the rotary striking force is transmitted to a screw via the not-shown tip end tool attached to the attachment hole 30a of the anvil 30.

Hereinafter, the similar operations are repeatedly performed to thereby intermittently and repeatedly transmit the rotary striking force to the screw from the tip end tool, whereby the screw is thread into a not-shown thread member such as a wood.

Figure 2:
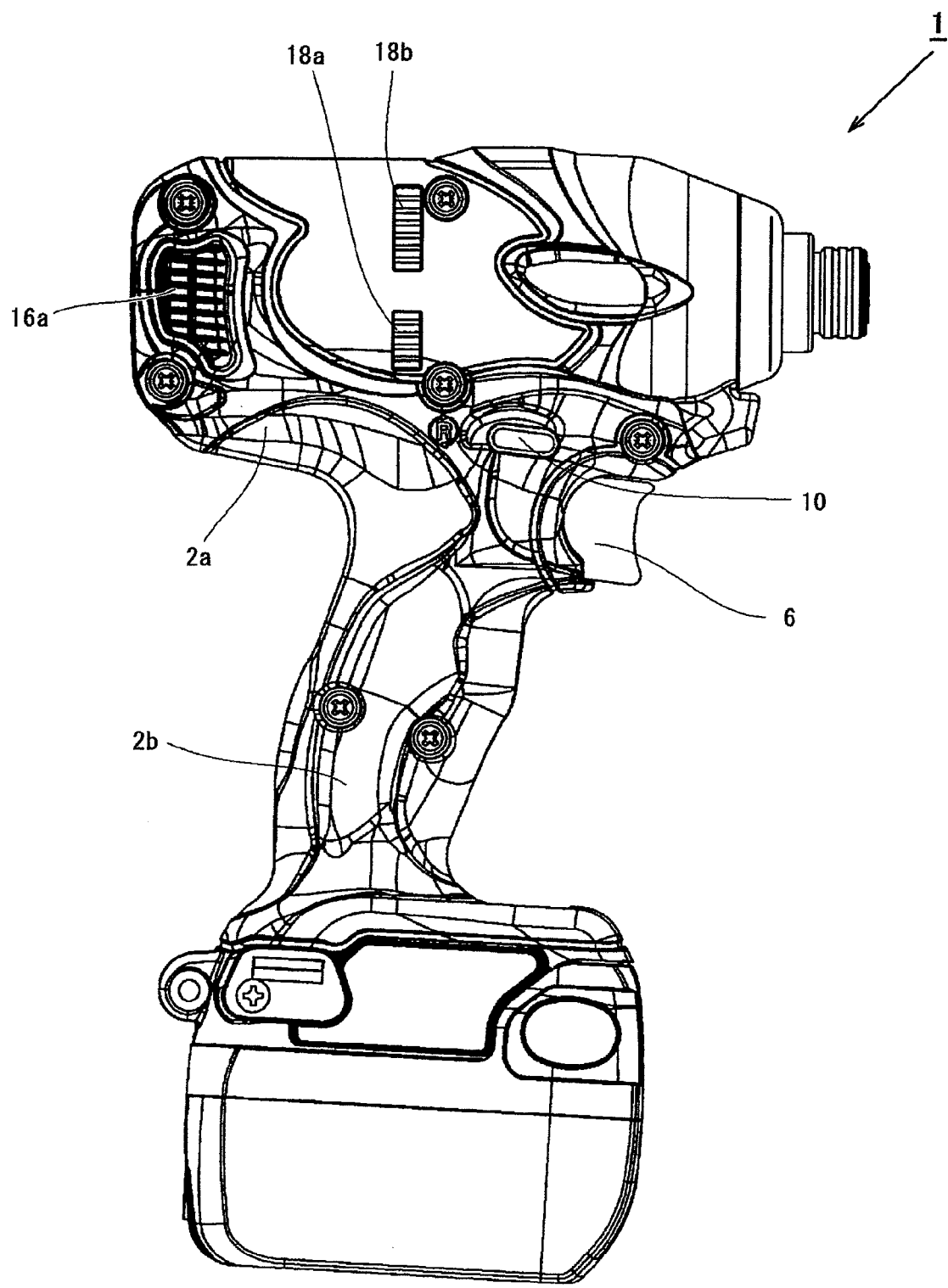
FIG. 2 is a side view showing the contour of the impact driver according to the first embodiment.
Figure 3:
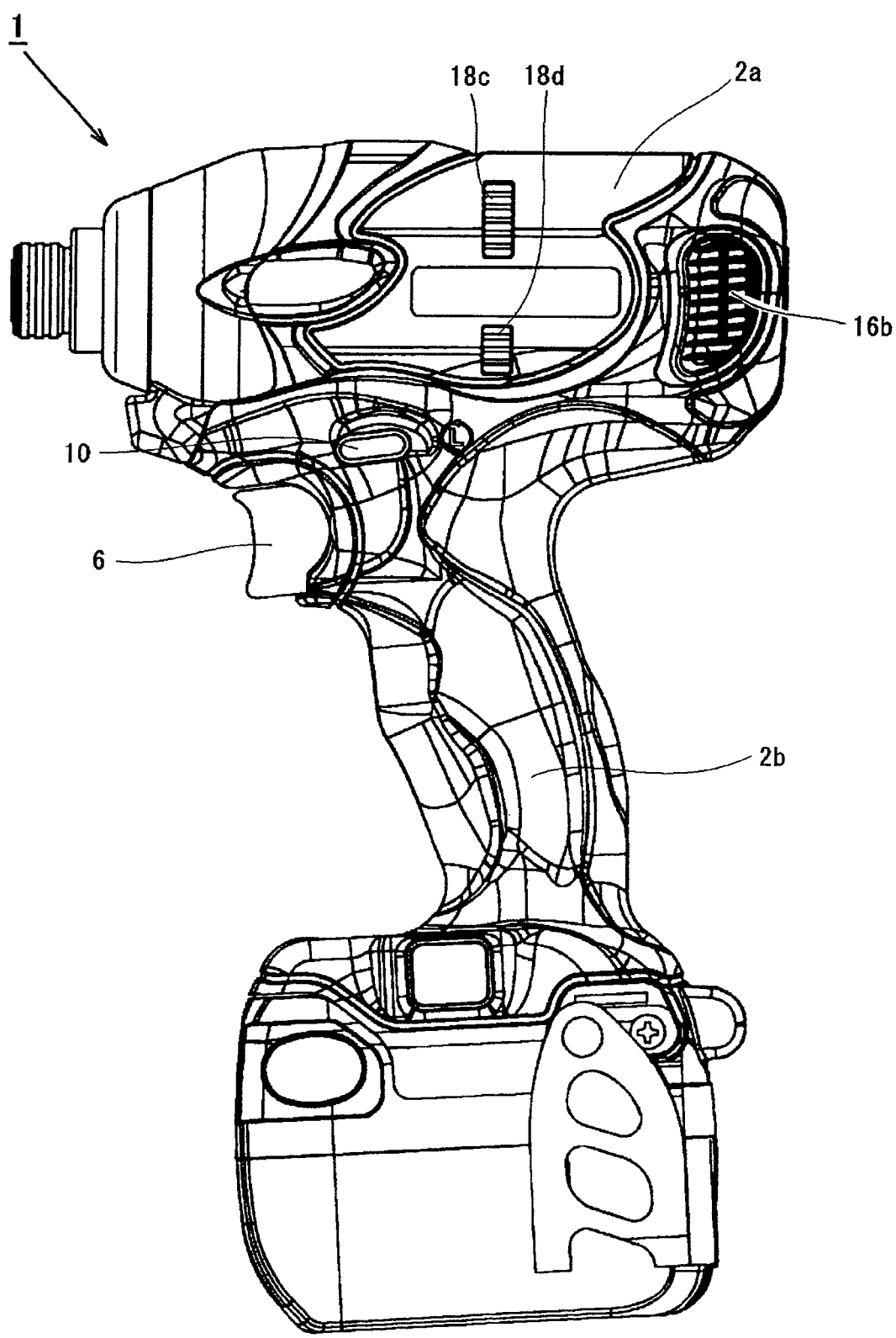
FIG. 3 is a side view showing the contour of the impact driver according to the first embodiment, which is seen from the opposite side of FIG. 2.

FIGS. 2 and 3 show a side view showing the exterior of the impact driver 1 according to the first embodiment. In FIG. 2, the suction slits 16a are formed on the outer periphery side of the inverter circuit board 4 of the body portion 2a of the housing 2, and the slits 18a, 18b are formed at the outer periphery portion of the rotor fan 13. Similarly, in FIG. 3, the suction slits 16b are formed on the outer periphery side of the inverter circuit board 4 of the body portion 2a of the housing 2, and the slits 18c, 18d are formed at the outer periphery portion of the rotor fan 13.

Next, the inverter circuit board 4 according to the embodiment will be explained with reference to FIGS. 5A and 5B. FIGS. 5A and 5B are diagrams showing the inverter circuit board 4, in which FIG. 5A is a rear view seen from the rear side of the impact driver 1 and FIG. 5B is a side view seen from the side surface thereof. The inverter circuit board 4 is formed by glass epoxy (glass fibers solidified by epoxy resin), for example, and has an almost circular shape which is almost same as the contour of the motor 3. The circuit board is provided at the center portion thereof with a hole 4a for passing the spacer 35 therein. Four screw holes 4b are formed at the periphery of the inverter circuit board 4 so that the inverter circuit board 4 is fixed to the stator 3b by screws passing through the screw holes 4b. The six switching elements 5 are attached to the inverter circuit board 4 so as to surround the hole 4a. Each of the switching elements 5 is a thin-type FET and may be a power MOS FET "IRF6648" manufactured by International Rectifier Corporation of U.S., for example. Each of the switching elements 5 has the surface area of 4.9 mm×6.3 mm and the height of 0.7 mm, and so is characterized by a quite small size and a low height.

As is understood from the side view of FIG. 5B, since each of the switching elements 5 has the quite thin thickness, in this embodiment, the switching elements 5 are attached to the inverter circuit board 4 by using the SMT (Surface Mount Technology) in a state of being laid on the board. The elements are attached so that, for example, after printing solder on the inverter circuit board 4 (or pasting an adhesive at part mounting positions using a dispenser), the switching elements 5 are mounted by using a chip mounter, and heat is applied to the board within a reflow furnace to melt the solder to thereby fix the switching elements 5 to the inverter circuit board 4. When the switching elements 5 are attached in this manner in the surface mounting manner, it is not necessary to form through holes at the inverter circuit board 4 and also it is not necessary to solder leg portions passed through the inverter circuit board 4 and exposed on the opposite side thereof.

Although not shown, it is desirable to coat resin such as silicon so as to cover the entirety of the six switching elements 5 of the inverter circuit board 4. When the circuit board is coated by the resin, a force or vibration applied to the switching elements 5 thus mounted in the surface mounting manner can be absorbed and further water drops or chips etc. can be prevented from adhering to the switching elements 5. Thus, the dustproof property can be improved and the drip proof property becomes excellent. It is preferable to use reins with excellent heat dissipation property in a view point of the cooling property. Since the inverter circuit board 4 is a double-sided board, the three position detecting elements 33 (only two elements are shown in FIG. 5B) and other electronic elements 34 such as capacitors and zener diodes are mounted on the front surface side.

The inverter circuit board 4 is configured so as to slightly protrude downward as compared with the circular configuration of the motor 3 and provided with a plurality of through holes 4d at the protruded portion, whereby the signal lines 11b are passed through these through holes from the front surface side and fixed by solders 38b on the rear surface side. Similarly, a power supply line 11a is passed through a through hole 4c of the inverter circuit board 4 from the front surface side and fixed by solder 38a on the rear surface side. In this case, it is considered to fix the signal lines 11b and the power supply line 11a to the inverter circuit board 4 via connectors fixed to the board. However, it is advantageous to directly fix these lines by the soldering in order to save a space on the front surface side of the inverter circuit board 4.

Figure 6A:
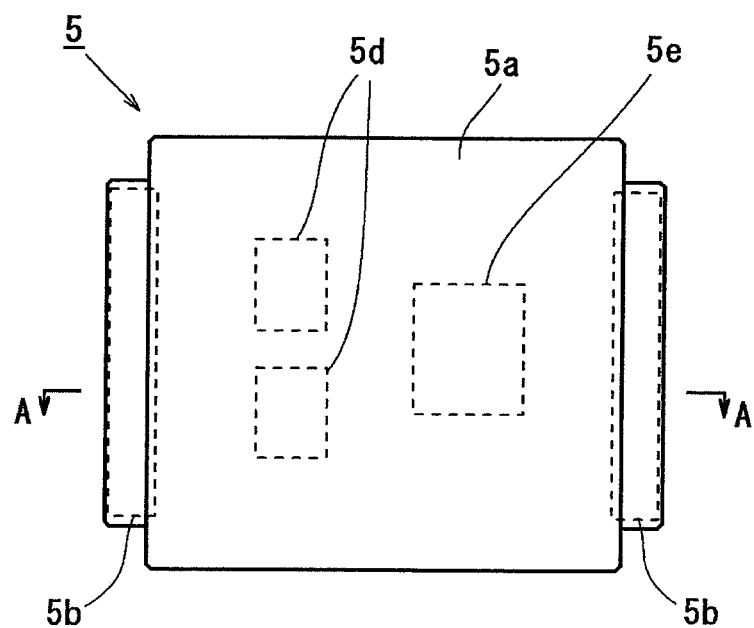
Figure 6B:
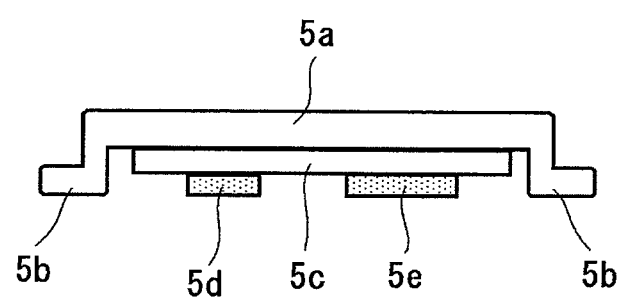

FIGS. 6A and 6B are diagrams showing the shape of the switching element 5, in which FIG. 6A is a top view of the switching element 5 seen from the upper side and FIG. 6B is a sectional view at a A-A portion of FIG. 6A. The switching element 5 is configured so that drain terminals 5b provided at a metal package main body 5a protrude in the left and right downward directions, respectively. The metal package 5a is formed by pressing aluminum, for example. A semiconductor element 5c acting as a main portion of the power MOS FET is fixed at the lower portion of the metal package 5a. The metal package 5a houses the semiconductor element 5c and also has a function acting as a heat dissipation plate and a function acting as the drain terminals 5b. Three metal terminals are attached to the lower side of the semiconductor element 5c. Two of these metal terminals are source terminals 5d and one of them is a gate terminal 5e. In this embodiment, all of the two drain terminals 5b, the two source terminals 5d and the one gate terminal 5e are soldered to the inverter circuit board 4 in the surface mounting manner.

Figure 7:
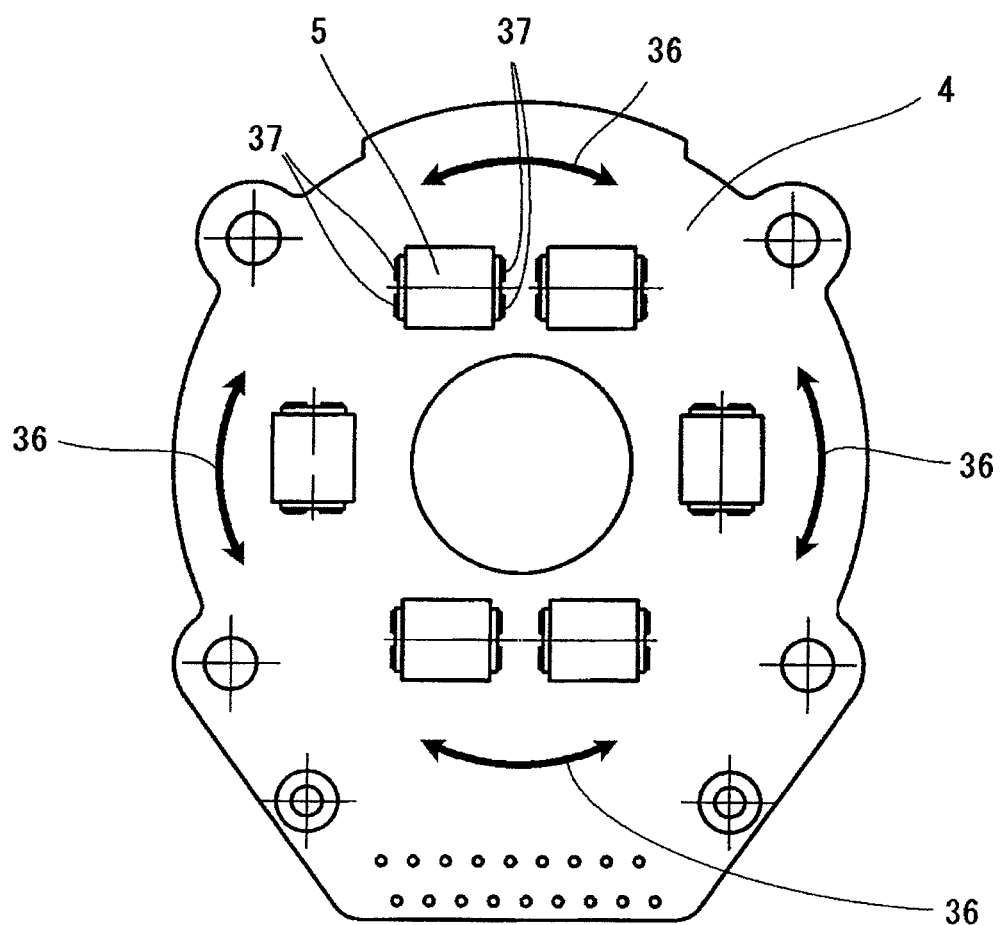
FIG. 7 is a diagram for explaining the arrangement of the switching elements 5 of FIG. 1.

FIG. 7 is a diagram for explaining the arrangement of the switching elements 5. In the impact driver 1, since the striking operation is intermittently performed with respect to the rotation direction of the anvil 30 by the rotary switching mechanism 21, strong vibration in the circumferential direction, that is, directions shown by an arrow 36 in FIG. 7 is transmitted to the switching elements 5 attached to the rear surface of the motor 3. When such the strong vibration is applied for a long time, the solders of the switching elements 5 formed in the surface mounting manner may be exfoliated. Thus, in this embodiment, each of the switching elements 5 is disposed so that the long side thereof is directed to the circumferential direction, that is, the longitudinal direction of each of the drain terminals 5b is directed to the circumferential direction so that the fixing force of the solder with respect to the vibration in the arrow 36 direction does not deteriorate. Each of the drain terminals 5b is not soldered at its entire area but provided with a not-soldered area near the center portion in the longitudinal direction thereof and is solders at plural portions, preferably, at two portions 37.

Figure 8:
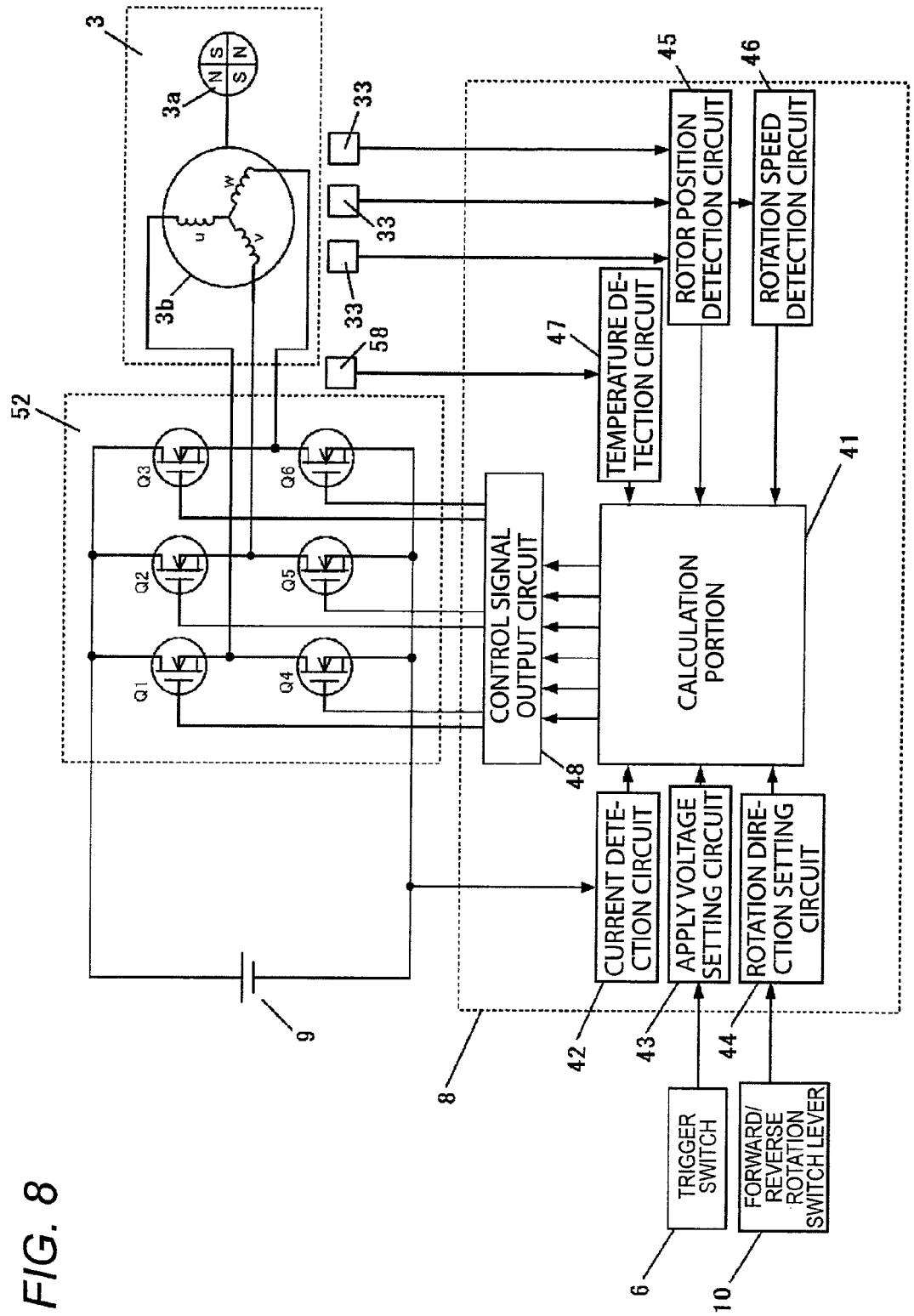
FIG. 8 is a block diagram showing the circuit configuration of the driving control system of a motor 3 according to first embodiment.

Next, the configuration and function of the driving control system of the motor 3 will be explained with reference to FIG. 8. FIG. 8 is a block diagram showing the configuration of the driving control system of the motor. In this embodiment, the motor 3 is configured as a three-phase brushless DC motor. This brushless DC motor is a so-called inner rotor type and so configured to include the rotor 3a having the magnet 15 containing a plural sets (two sets in this embodiment) of N and S poles, the stator 3b formed by three-phase stator windings U, V, W of the star-connection, and the three position detecting elements 33 disposed in the circumferential direction with a predetermined interval, for example, an angle of 60 degrees in order to detect the rotation position of the rotor 3a. The motor 3 is rotated so that flowing direction and flowing time of the current in each of the stator windings U, V, W is controlled based on the rotation position detection signals from these position detecting elements 33. The position detecting elements 33 are disposed at positions opposing to the magnet of the rotor 3a on the inverter circuit board 4.

The electronic elements mounted on the inverter circuit board 4 include six switching elements Q1 to Q6 such as FETs (Field Effect Transistors) coupled in a three-phase fashion. The respective gates of the six switching elements Q1 to Q6 are coupled to a control signal output circuit 48 mounted on the control circuit board 8, and the respective drains or sources of the six switching elements Q1 to Q6 are coupled to the stator windings U, V, W of the star-connection. Thus, the six switching elements Q1 to Q6 perform the switching operations in accordance with switching element driving signals (driving signals such as H4, H5, H6) inputted from the control signal output circuit 48 to thereby convert the DC voltage of the battery 9 applied to an inverter circuit 52 into three-phase (U-phase, V-phase, W-phase) voltages Vu, Vv, Vw and supply these voltages to the stator windings U, V, W.

Among these switching element driving signals (three-phase signals) for driving the respective gates of the six switching elements Q1 to Q6, the driving signals for the three negative power supply side switching elements Q4, Q5, Q6 are supplied as pulse width modulation signals (PWM signals) H4, H5, H6, respectively. A calculation portion 41 mounted on the control circuit board 8 changes the pulse widths (duty ratios) of the PWM signals based on the detection signal of the trigger operation amount (stroke) of the trigger switch 6 to adjust a power supply amount to the motor 3 to thereby control the start/stop and the rotation speed of the motor 3.

The PWM signals are supplied to the positive power supply side switching elements Q1, Q2, Q3 or the negative power supply side switching elements Q4, Q5, Q6 to switch the switching elements Q1, Q2, Q3 or the switching elements Q4, Q5, Q6 at a high speed, whereby the electric powers respectively supplied to the stator windings U, V, W are controlled based on the DC voltage from the battery 9. In this embodiment, since the PWM signals are supplied to the negative power supply side switching elements Q4, Q5, Q6, when the pulse widths of the PWM signals are controlled, the electric power supplied to the respective stator windings U, V, W are controlled, whereby the rotation speed of the motor 3 can be controlled.

The impact driver 1 is provided with the forward/reverse rotation switch lever 10 for switching the rotation direction of the motor 3. A rotation direction setting circuit 44 transmits a control signal for switching the rotation direction of the motor at every detection of the change of the forward/reverse rotation switch lever 10. Although not shown, the calculation portion 41 includes a central processing unit (CPU) for outputting the driving signals based on a processing program and data, a ROM for storing the processing program and the control data, a RAM for temporarily storing the data, and a time, etc.

The calculation portion 41 generates the driving signals for alternately switching the predetermined switching elements Q1 to Q6 based on the output signals from the rotation direction setting circuit 44, a rotor position detection circuit 45 and a rotation speed detection circuit 46, and supplies the driving signals to the control signal output circuit 48. Thus, the current is alternately supplied to the predetermined windings of the stator windings U, V, W to thereby rotate the rotor 3a in the rotational direction thus set. In this case, the driving signals to be applied to the negative power supply side switching elements Q4, Q5, Q6 on the inverter circuit board 4 are outputted as the PWM modulation signals based on the output control signals of an apply voltage setting circuit 43. The value of the current supplied to the motor 3 is measured by a current detection circuit 42, then the measured value is fed back to the calculation portion 41, whereby the driving power supplied to the motor is adjusted so as to be a set value. The PWM signals may be applied to the positive power supply side switching elements Q1 to Q3.

As a characteristic configuration of the embodiment, a temperature sensor 58 for detecting the temperature of the switching elements 5 in the inverter circuit 52 is provided, whereby a temperature detection circuit 47 always monitors the temperature of the switching elements 5 or the periphery thereof. The temperature detection circuit 47 detects the temperature of the switching elements 5 and outputs the detected value to the calculation portion 41. When the calculation portion 41 determines that the detected temperature increases to a preset reference value or more, the calculation portion outputs an alarm to limit or stop the rotation of the motor 3.

As described above, according to this embodiment, since the thin type FETs are mounted as the switching elements 5 on the inverter circuit board 4 in the surface mounting manner, the length in the longitudinal direction of the body portion 2a of the housing 2 can be reduced to a large extent. According to this embodiment, since the thin type FETs are mounted on the inverter circuit board 4 in the surface mounting manner, the leg portions of the FETs are prevented from being exposed on the opposite side of the inverter circuit boar and hence a space for mounting the switching elements can be made small. Since the FETs can be fixed to the board by the simple processing of the surface mounting processing, the workability can be improved.

Figure 9:
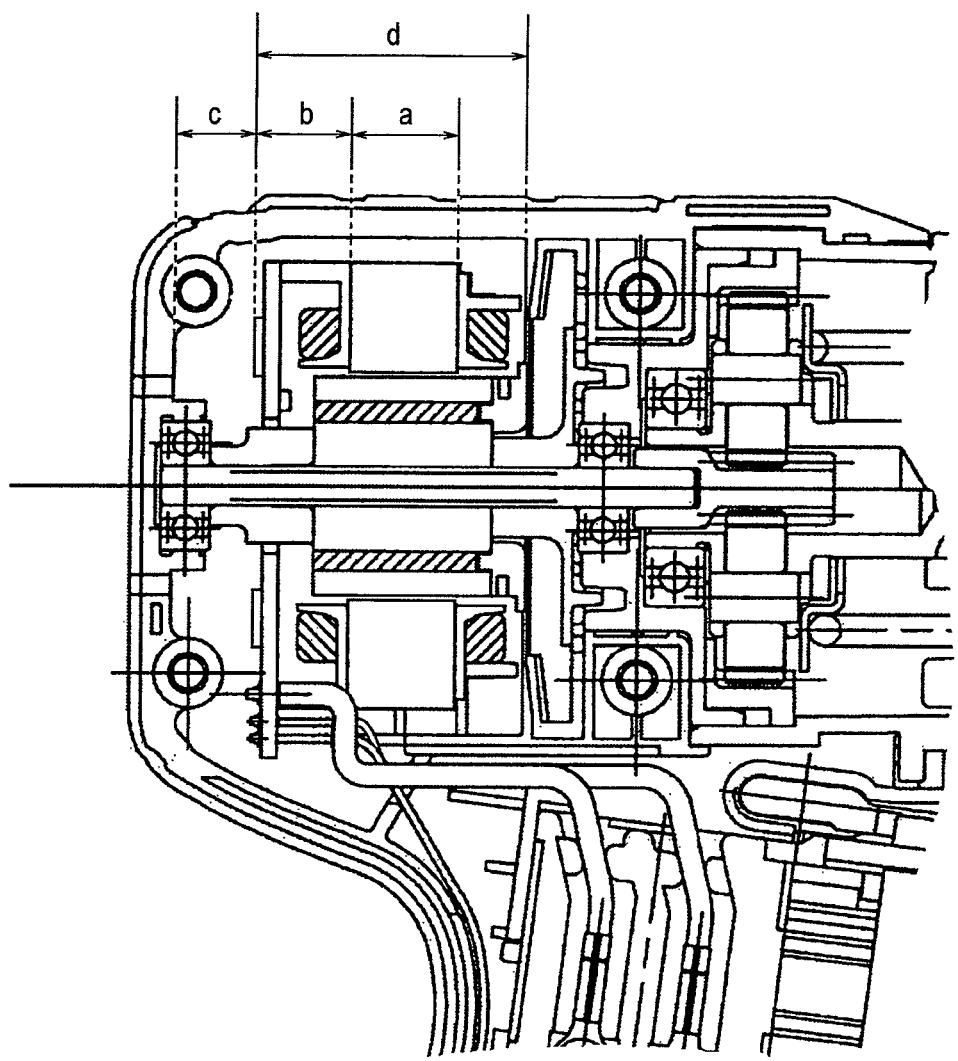
FIG. 9 is a diagram for explaining the arrangement state of the motor 3 and the body portion 2a of the housing 2 of FIG. 1.

In this embodiment, in the inverter driver having the entire height of about 240 mm and the fastening torque of 160 N·m, the length thereof in the longitudinal direction can be set about 140 mm or less. As shown in FIG. 9, although a length (a) of the stator core of the motor 3 is 11 mm, a distance (b) from the rear end of the stator core to the rear end portions of the switching elements 5 on the inverter circuit board 4 is only 9 mm, and further a distance (c) from the rear end portions of the switching elements 5 to the inner wall of the housing 2 is only 8.6 mm. Thus, a length (d) of the housing portion of the motor 3 of the body portion 2a can be reduced to a large extent. Since the distance (c) from the rear end portions of the switching elements 5 to the inner wall of the housing 2 is reduced to 8.6 mm, the air likely flows along the surface of the inverter circuit board 4, so that the cooling efficiency can be improved.

Figure 10:
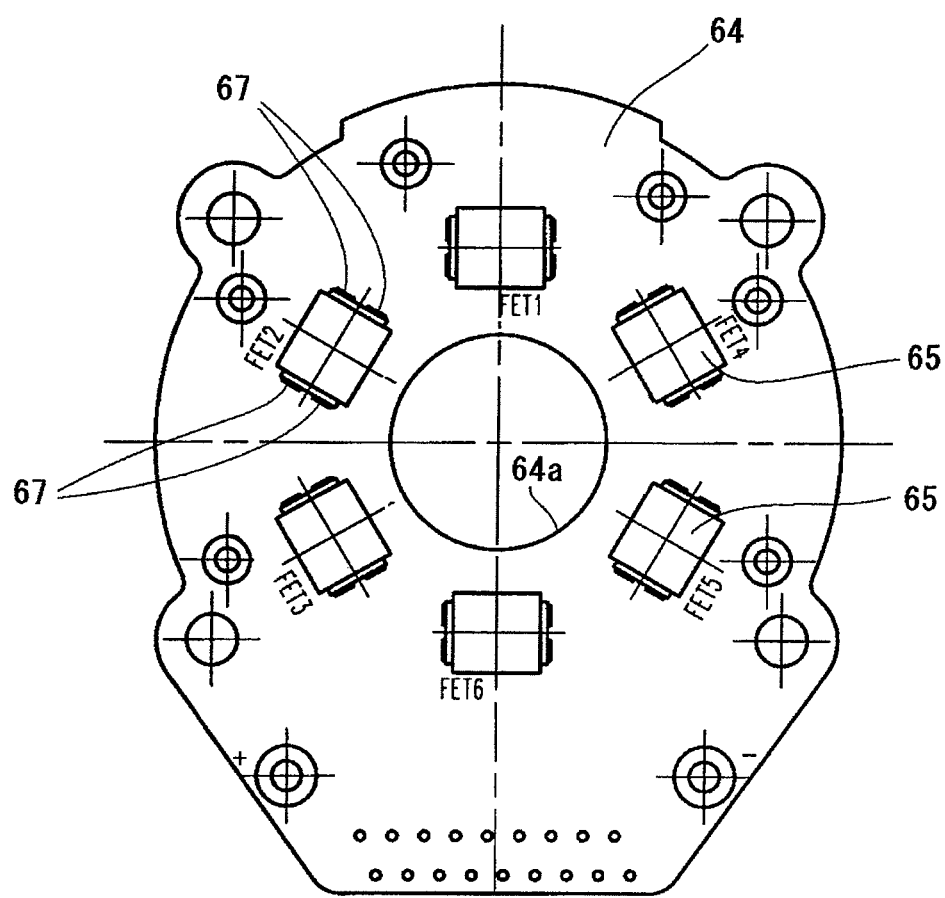
FIG. 10 is a diagram for explaining the arrangement of a switching element 65 according to a second embodiment of the invention.

Next, a second embodiment of the invention will be explained with reference to FIG. 10. FIG. 10 differs from the first embodiment in the arrangement of switching elements 65. The respective switching elements 65 mounted on an inverter circuit board 64 are disposed with the same interval so that the long side of each of the elements is directed to the circumferential direction and the short side having the drain terminal of each of the elements is directed to the radial direction. The circuit board has a hole 64a. This embodiment is same as the first embodiment in a point that each of the drain terminals is soldered at two portions 67. Also in the second embodiment, the elements are attached by the soldering using the surface mounting processing. Silicon may be preferably coated on the entire surface of the rear side surface of the inverter circuit board 64 so as to cover the surfaces of the switching elements 65 or on a partial area sufficiently cover at least the switching elements 65. In this manner, since the switching elements 65 are disposed with the same interval, the influence of the adjacent switching elements 65 can be advantageously reduced in a view point of the cooling.

Figure 11:
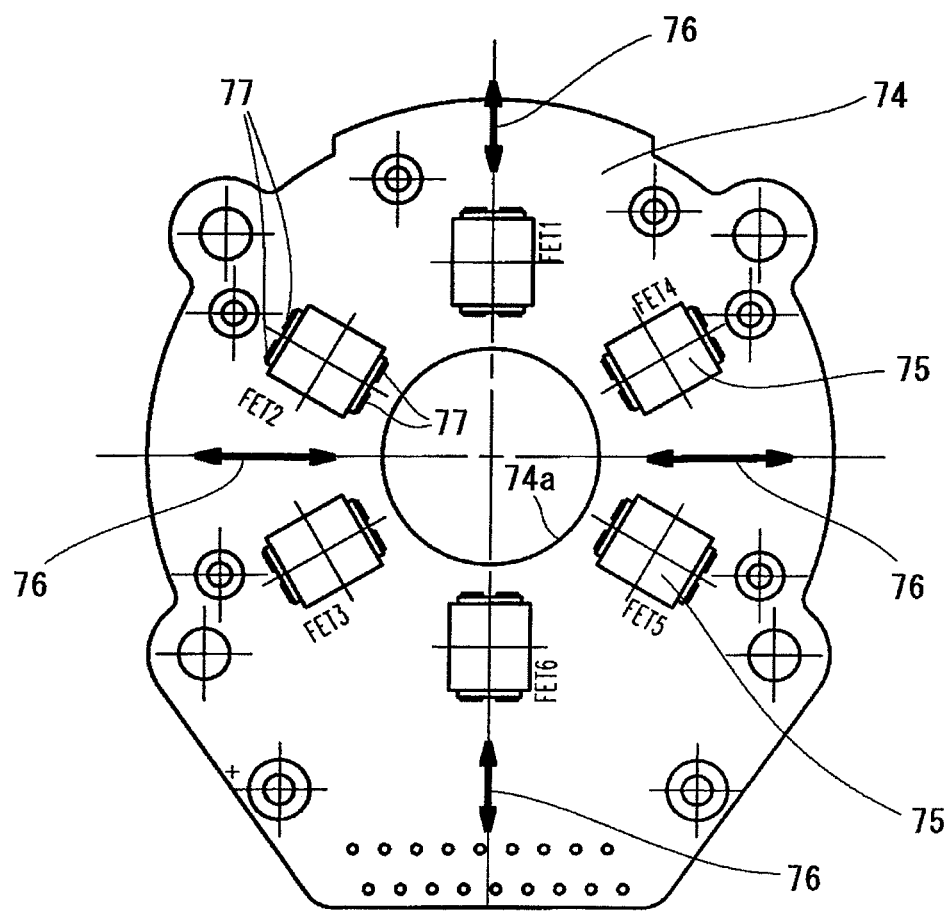
FIG. 11 is a diagram for explaining the arrangement of a switching element 75 according to a second embodiment of the invention.

Next, a third embodiment of the invention will be explained with reference to FIG. 11. FIG. 11 differs from the first embodiment in the arrangement of switching elements 75. Each of the respective switching elements 75 mounted on an inverter circuit board 74 is disposed so that the long side thereof is directed to the radial direction and the both short sides having the drain terminal thereof are located at the inner peripheral side and the outer peripheral side, respectively. The circuit board has a hole 74a. This embodiment is same as the first and second embodiments in a point that each of the drain terminals is soldered at two portions. The third embodiment is effective in a case that the vibration likely occurs in a radial direction 76 due to the characteristics of the kind and structure etc. of the tip end tool of the power tool or in a case of opposing to or canceling the influence of the vibration in this direction. Also in the third embodiment, the elements are attached by the soldering using the surface mounting processing. Silicon may be preferably coated on the inverter circuit board 74 so as to cover the surfaces of the switching elements 75. Also in the third embodiment, since the respective switching elements 75 are disposed with the same interval in the circumferential direction of the inverter circuit board 74, the influence of the adjacent switching elements 75 can be advantageously reduced in a view point of the cooling.

Although the explanation is made as to the configuration using the switching elements 5 housed within the metal casing of a flat and almost rectangular shape with reference to the first to third embodiments, the kinds of the switching elements to be used are not limited thereto. The invention can be realized by using another type of FETs capable of being surface-mounted on the circuit board. Such an example will be explained with reference to FIGS. 12 to 14.

Figure 12:
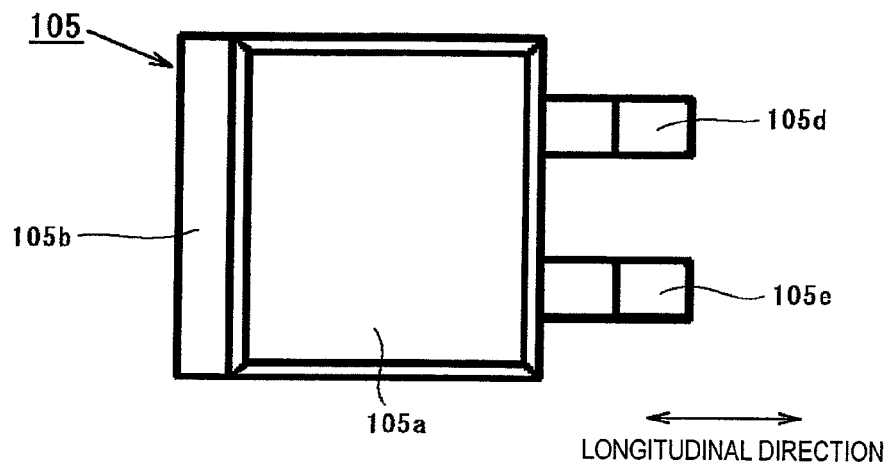
FIG. 12 is a top view showing a switching element employed in fourth to seventh embodiments of the invention.
Figure 13:
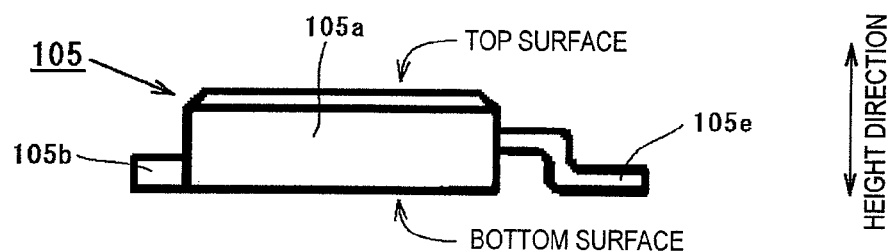
FIG. 13 is a side view showing the switching element employed in the fourth to seventh embodiments.
Figure 14:
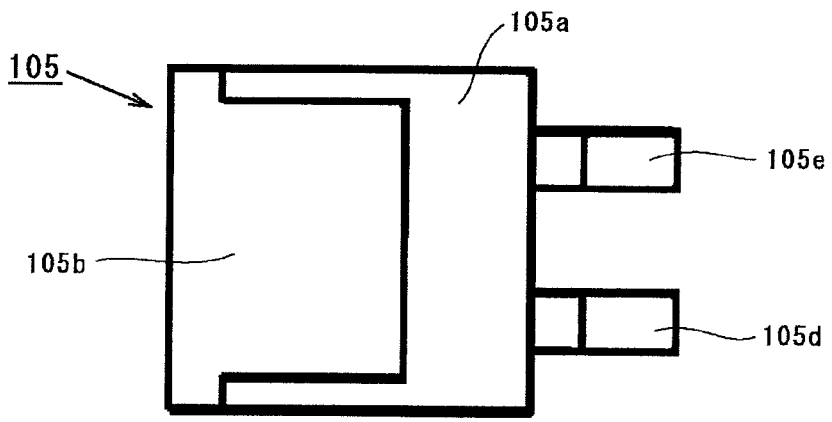
FIG. 14 is a bottom view showing the switching element employed in the fourth to seventh embodiments.

FIGS. 12 to 14 are diagrams showing a switching element capable of being surface-mounted on a circuit board. FIG. 12 is a top view, FIG. 13 is a side view and FIG. 14 is a bottom view. This switching element 105 may be a large-capacity FET housed within a resin casing, for example, a power MOS FET "IRFS4229" manufactured by International Rectifier Corporation of U.S. This FET is configured so that a drain terminal is disposed at the bottom surface thereof, and each of a source terminal and a gate terminal extends from the side surface thereof, then is bent on the way thereof and extends to the circuit board. Thus, each of these terminals can be coupled to the surface of the circuit board and also surface-mounted on the circuit board.

FIG. 12 is the top view of the switching element 105. When it is defined that the direction of the long side of the outer size of the switching element 105 is the longitudinal direction, a drain terminal 105b acting as a first terminal is provided at the one end side in the longitudinal direction of a package 105a, and a source terminal 105d acting as a second terminal and a gate terminal 105e are provided at the other end side in the longitudinal direction. The package 105a is a casing for covering the semiconductor element contained therein by high polymer resin such as plastics.

FIG. 13 is the side view of the switching element 105. The drain terminal 105b is configured so that the bottom surface thereof is formed almost on the same plane as the bottom surface of the package 105a and extends from the one end side (left side) in the longitudinal direction of the package 105a. The gate terminal 105e is configured so that it extends from about the center portion in the height direction of the package on the other end side (right side) in the longitudinal direction of the package 105a, then is bent downward on the way thereof and further bent in the transversal direction and extends so that the bottom surface thereof is formed almost on the same plane as the bottom surface of the package 105a.

Although not shown in FIG. 13, the source terminal 105d has the same shape as the gate terminal 105e. In this manner, since each of the plural terminals of the switching element 105 is configured so that the bottom surface thereof is formed almost on the same plane as the bottom surface of the package 105a, the switching element 105 can be attached to the circuit board in the surface mounting manner so that the element is located at the circuit board in a state of being laid transversely. In this case, "laid transversely" means that the switching element 105 is disposed so that the longitudinal direction thereof is in parallel to the circuit board to be mounted thereon and the bottom surface of the switching element 105 opposes to the circuit board.

FIG. 14 is a diagram showing the switching element 105 seen from the bottom side thereof. Although the drain terminal 105b is configured to continue with the bottom surface of the package 105a, the drain terminal is configured to have a relatively large area in order to enhance the heat dissipation effect. To be exact, the package 105a is configured so that the corners on the upper surface side of the package 105a are trimmed as shown in FIG. 13 and the drain terminal 105b largely occupies the bottom surface side of the package 105a. However, the basic external shape of the package 105a is an almost rectangular parallelepiped. The shape of the switching element is arbitrary so long as the switching element 105 is a flat type having a low height in the height direction thereof in order to attain the effects of the invention. Thus, in this specification, the shape of the package is called as an almost rectangular parallelepiped, including the shape of the package 105a shown in FIGS. 12 to 14.

The switching elements are not limited to those shown in FIGS. 12 to 14 and other FETs etc. may be employed so long as the height thereof is low in the case of being laid transversely. In FIGS. 12 to 14, the switching element is configured so that the bottom surfaces of the drain terminal 105b, the source terminal 105d and the gate terminal 105e are same in the height as the bottom surface of the package 105a. However, the switching element may be configured so that only the bottom surface of the package 105a is set to be slightly higher than the other bottom surfaces so that the bottom surface of the package 105a separates slightly from the circuit board when the switching element is surface-mounted on the circuit board in the transversely laid state.

Figure 15:
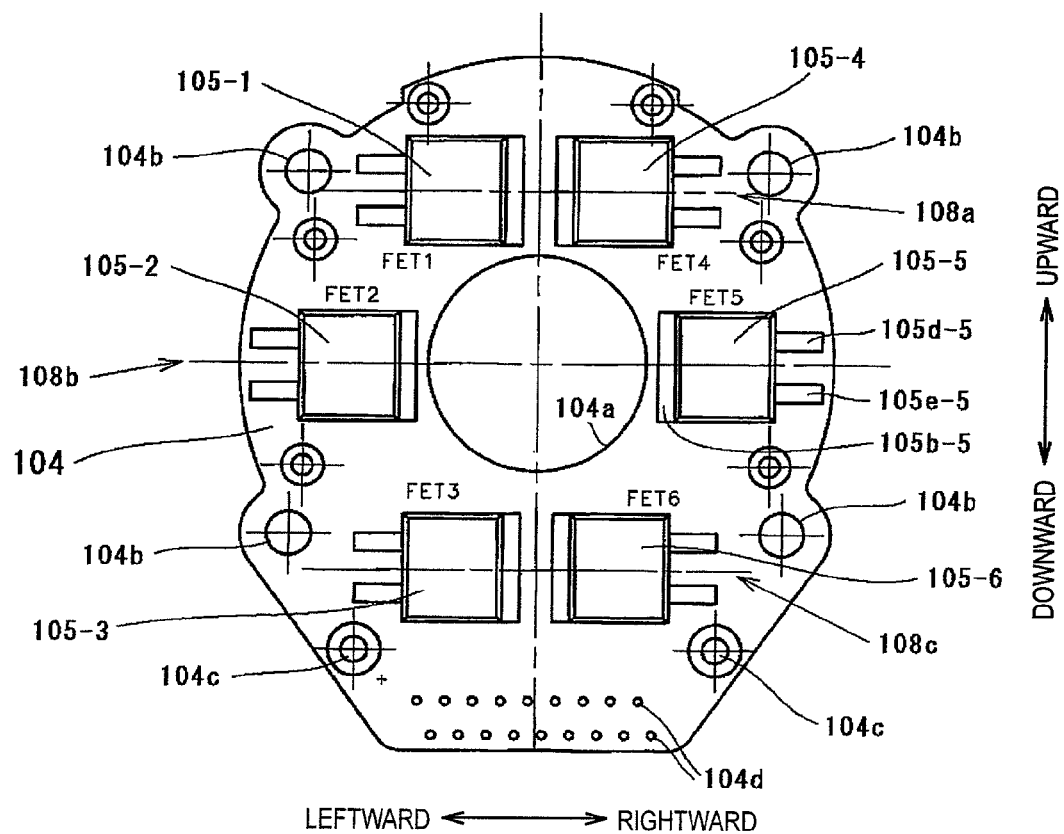
FIG. 15 is a diagram for explaining the arrangement of a switching element 105 according to the fourth embodiment.

Next an example of mounting the switching element 105 on the circuit board will be explained with reference to FIGS. 15 to 18. FIG. 15 is a diagram for explaining the arrangement of a switching element 105 according to the fourth embodiment of the invention and is a diagram showing an inverter circuit board 104 seen from the rear side. The inverter circuit board 104 has an almost circular shape which is almost same as the contour of the motor 3 and is provided at the center portion thereof with a hole 104a for passing a spacer 35 therethrough. Four screw holes 104b are formed at the periphery of the inverter circuit board 104 and the inverter circuit board 104 is fixed to the stator 3b by means of screws passed through the screw holes 104b. Six switching elements 105-1 to 105-6 each having the shape shown in FIGS. 12 to 14 are attached to the inverter circuit board 104 so as to surround the hole 104a. The six switching elements 105 are attached to the rear surface side (opposite side to the motor 3) of the inverter circuit board 104 in the surface mounting manner.

The switching elements 105-1 and 105-4 are disposed so as to be aligned on a center line 108a thereof extending along the longitudinal direction of these elements. Similarly, the switching elements 105-2 and 105-5 are disposed so as to be aligned on a center line 108b thereof extending along the longitudinal direction of these elements. The switching elements 105-3 and 105-6 are disposed so as to be aligned on a center line 108c thereof extending along the longitudinal direction of these elements. The center lines 108a, 108b and 108c are almost in parallel from one another.

A rotation shaft 12 and the spacer 35 pass through the hole 104a of the inverter circuit board 104. The air sucked into the housing 2 form the air intake ports 17a, 17b (FIG. 1) flows into the motor 3 via the gap between the hole 104a and the spacer 35. In this embodiment, since the gap between the hole 104a and the spacer 35 is made small, the air thus sucked unlikely enters into the motor 3. As a result, since fine particles unlikely enters into the motor 3, excellent dust-proof property can be obtained. In the embodiment shown in FIG. 15, the switching elements 105-1 to 105-6 are disposed so that the longitudinal directions of these elements are in parallel from one another. The drain terminals 105b of the switching elements 105 are disposed on the inner peripheral side (that is, the side facing to the hole 104a) of the inverter circuit board 104, and the source terminals 105d and the gate terminals 105e are disposed on the outer peripheral side.

Figure 16:
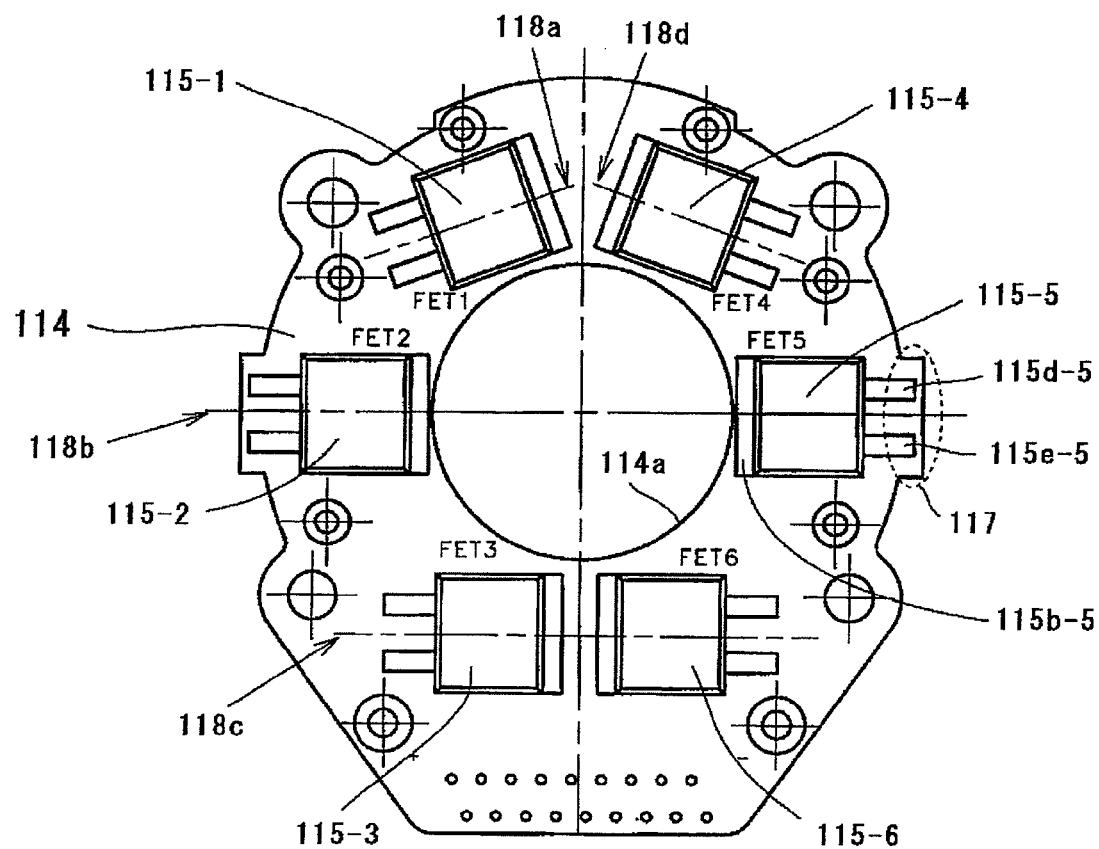
FIG. 16 is a diagram for explaining the arrangement of a switching element 115 according to the fifth embodiment.

FIG. 16 is a diagram for explaining the arrangement of a switching element 115 according to the fifth embodiment of the invention. This embodiment differs from FIG. 15 in a point that the diameter of a hole 114a at the center portion of an inverter circuit board 114 for passing the spacer 35 therethrough is large. Since the hole 114a is made large, the gap between the hole 114a and the spacer 35 becomes larger. Thus, the air sucked from the outside likely enters into the motor 3, so that advantageously the motor 3 can be cooled effectively.

Since the hole 114a is made large, the arrangement of the switching elements 115-1 to 115-6 is slightly changed. That is, although the arrangement of the switching elements 115-3 and 115-6 is same as that of FIG. 15, the switching elements 115-2, 115-5 are shifted to the outer periphery side in accordance with the enlargement of the hole 114a. This embodiment is same as FIG. 15 in a point that the switching elements 115-2 and 115-5 are disposed so as to be aligned on a center line 118b thereof extending along the longitudinal direction of these elements, the switching elements 115-3 and 115-6 are disposed so as to be aligned on a center line 118c thereof extending along the longitudinal direction of these elements, and the center lines 118b and 118c are almost in parallel to each other. However, in this embodiment, each of the center line 118a of the switching element 115-1 and the center line 118d of the switching element 115-4 is inclined with respect to the center lines 118b, 118c.

In this embodiment, since all the switching elements can not be disposed on the circuit board when the circuit board has the same external shape as the inverter circuit board 104 of FIG. 15, the inverter circuit inverter circuit board 114 is provided with a protruding portion 117 of an almost rectangular shape which protrudes outwardly and the source terminal 115d-5 and the gate terminal 115e-5 of the switching element 115-5 are disposed at the protruding portion 117 (also same on the switching element 115-2 side). Due to the enlargement of the hole 114a, each of the switching elements 115-1 and 115-4 is mounted in an inclined manner in the circumferential direction.

Figure 17:
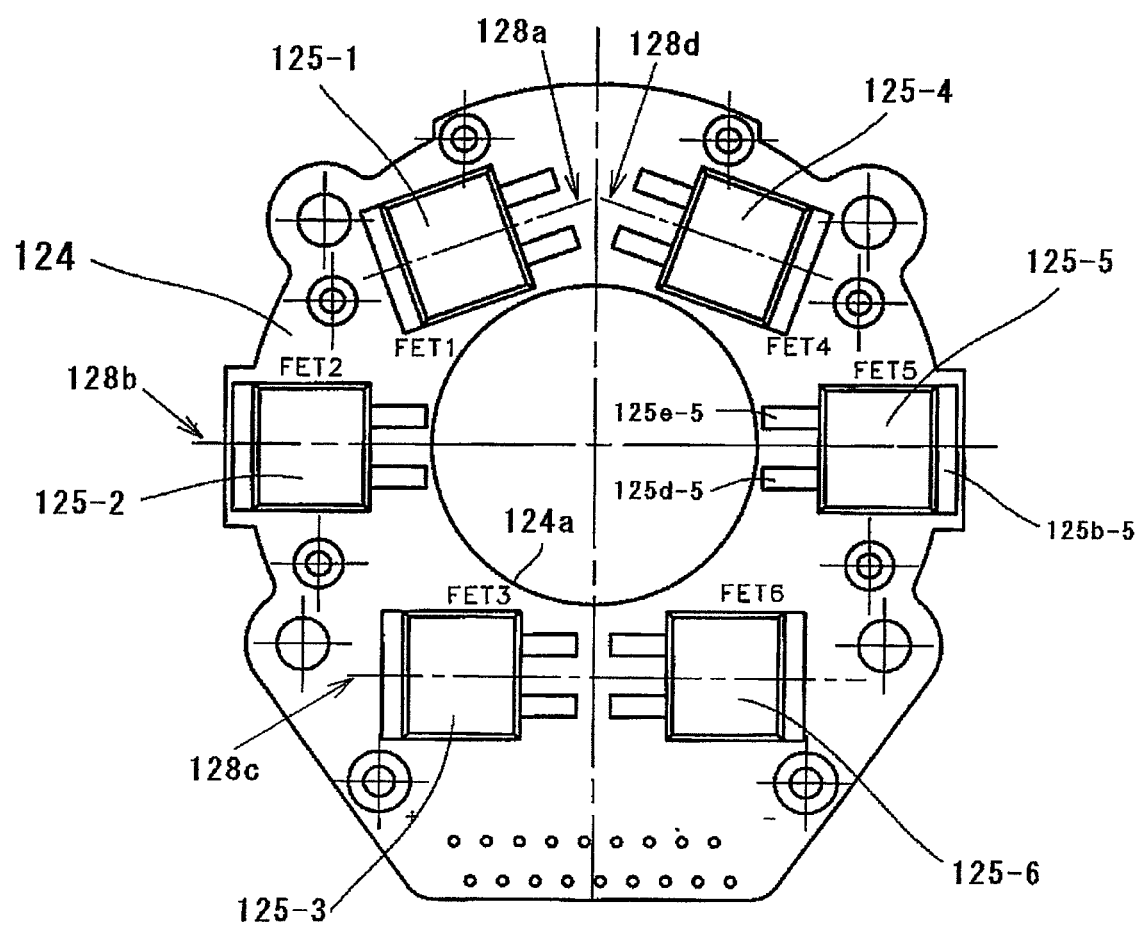
FIG. 17 is a diagram for explaining the arrangement of a switching element 125 according to the sixth embodiment.

FIG. 17 is a diagram for explaining the arrangement of a switching element 125 according to the sixth embodiment of the invention. In FIG. 17, like FIG. 16, a gap between a hole 124a and the spacer 135 is made large by enlarging the size of the hole. However, the arrangement of respective switching elements 125-1 to 125-6 in the longitudinal direction is in opposite to that of FIG. 16. That is, the drain terminals 125b of the switching elements 125-1 to 125-6 are disposed on the outer periphery side of an inverter circuit board 124, and the source terminals 125d and the gate terminals 125e thereof are disposed on the inner periphery side of the circuit board.

The switching elements 125-2 and 125-5 are disposed so as to be aligned on a center line 128b thereof extending along the longitudinal direction of these elements, the switching elements 125-3 and 125-6 are disposed so as to be aligned on a center line 128c thereof extending along the longitudinal direction of these elements, and the center lines 128b and 128c are almost in parallel to each other. Each of the center line 128a of the switching element 125-1 and the center line 128d of the switching element 125-4 is inclined with respect to the center lines 128b, 128c.

Figure 18:
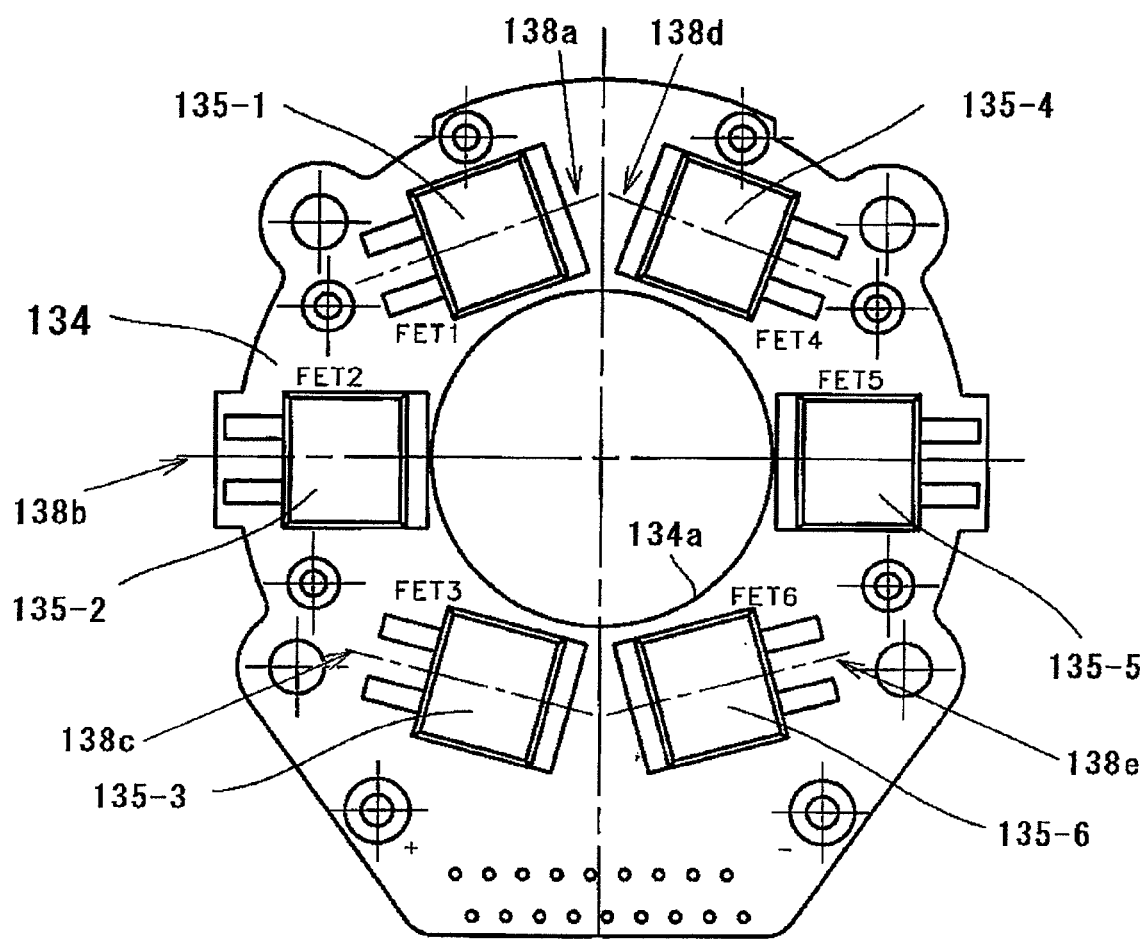
FIG. 18 is a diagram for explaining the arrangement of a switching element 135 according to the seventh embodiment.

FIG. 18 is a diagram for explaining the arrangement of a switching element 135 according to the seventh embodiment of the invention. FIG. 18 differs from the arrangement of FIG. 16 in a point that switching elements 135-3 and 135-6 are inclined so that the longitudinal directions of these elements are directed to the circumferential direction of a hole 134a. That is, although switching elements 135-2 and 135-5 are disposed so as to be aligned on a center line 138b thereof extending along the longitudinal direction of these elements, remaining switching elements 135-1. 135-3, 135-4, 135-6 are inclined so that the longitudinal direction of these elements is inclined with respect to the center line 118b as shown by the center lines 138a, 138c, 138d, 138e of these elements.

As explained above, although the fourth to seventh embodiments respectively employ the switching elements 105, 115, 125, 135 each having the resin package in place of the switching element 105 having the metal package, each of these embodiments can obtain the same effects as the first to third embodiments since the element is surface-mounted on the circuit board in a state that the resin casing thereof is laid transversely.

As clear from the aforesaid explanation, according to the invention, since the switching elements each having a flat and elongated shape are fixed on the circuit board in the surface mounting manner, the space required for the elements mounted on the circuit board can be reduced to a large extent. Thus, the power tool can be realized in which the size on the rear end side of the motor in the body portion of the housing of the power tool is made small and the length of the body portion is short. Accordingly, the portion around the motor can be made small, light-weighted and concentrated, whereby the power tool excellent in usability can be realized.

The invention is not limited to the aforesaid embodiments and various modification may be made in a range not departing from the gist of the invention. For example, although the explanation is made as to the impact driver as an example of the power tool, the power tool according to the invention is not limited thereto and the invention can be applied to other power tools in the similar manner so long as the brushless motor is employed as the motor acting as the driving source. Although the switching elements are surface-mounted on the rear surface of the inverter circuit board which is provided in the vertical direction with respect to the rotation shaft on the rear surface side of the motor, the switching elements may be disposed on the front surface side (rotor 3a side) as well as the rear surface side. The inverter circuit board may be disposed at an arbitrary position within the body portion of the housing such as the lower portion or the side portion of the motor in place of the rear surface side of the motor.

This application claims priority from Japanese Patent Application No. 2008-250356 filed on Sep. 29, 2008, and from Japanese Patent Application No. 2009-041419 filed on Feb. 24, 2009, the entire contents of which are incorporated herein by reference.

INDUSTRIAL APPLICABILITY

According to an aspect of the invention, there is provided a power tool in which the shape of each of switching elements of a brushless motor is changed and an attachment method of the switching elements is improved.

According to another aspect of the invention, there is provided a power tool using a brushless motor, in which a housing for containing the motor therein is made small

The invention claimed is:

1. A power tool comprising:
a brushless motor including a rotation shaft extending in a front-rear direction;
a fan attached to the rotation shaft;
switching elements that drive the brushless motor;
a circuit board on which the switching elements are mounted;
a tip end tool hold portion that holds a tip end tool;
a transmission portion that transmits a driving force of the brushless motor; and
a housing that houses the brushless motor, the fan, the switching elements, the circuit board and the transmission portion therein and includes suction openings formed on a periphery side of the circuit board and a rear side of the circuit board and an opening formed at a periphery portion of the fan,
wherein the switching elements include semiconductor elements each having terminals on a bottom surface thereof,
wherein the switching elements are surface mounted on the circuit board, and
wherein the fan is configured to draw air into the housing from the suction openings formed on the periphery side and the rear side of the circuit board such that the air flows along a surface of the circuit board and is exhausted to the outside of the housing from the opening formed at the periphery portion of the fan.

2. The power tool according to claim 1,
wherein each of the switching elements has:
a metal case that is formed in a substantially flat rectangular shape and that covers a corresponding one of the semiconductor elements; and
drain terminals that are respectively formed on lower portions of opposing two sides of the metal case, and
wherein each of the drain terminals is surface-mounted on the circuit board through a solder portion.

3. The power tool according to claim 2,
wherein the circuit board is positioned on a rear surface side of the brushless motor so as to be oriented in a vertical direction with respect to a rotation shaft of the brushless motor.

4. The power tool according to claim 3,
wherein the switching elements include six switching elements, the six switching elements being fixed on one surface of the circuit board, the other surface of the circuit board facing the motor.

5. The power tool according to claim 4,
wherein each of the drain terminal is fixed to the circuit board at two partial areas thereof, the two partial areas being separated from each other, the solder portion being provided on each of the two partial areas.

6. The power tool according to claim 5,
wherein each of the six switching elements is disposed on the circuit board so that the other two sides of the metal case at which the drain terminal is not provided become substantially parallel to a circumferential direction around the rotation shaft.

7. The power tool according to claim 1,
wherein the six switching elements are surface mounted on a surface of the circuit board, and
wherein a resin is coated on the surface of the circuit board so as to cover the switching elements.

8. The power tool according to claim 1,
wherein the housing includes:
a body portion that houses the brushless motor and the transmission portion therein; and
a grip portion that extends from the body portion so as to be substantially orthogonal thereto, and
wherein the circuit board is provided at the body portion.

9. The power tool according to claim 1,
wherein the circuit board has a hole to pass a rotation shaft of the brushless motor therethrough and is disposed so as to be substantially orthogonal to the rotation shaft,
wherein the semiconductor elements housed in a resin casing are used as the switching elements, respectively,
wherein the switching elements are disposed around the hole of the circuit board in a transversely-laid state,
wherein at least part of the switching elements are disposed so that longitudinal directions thereof become substantially parallel with one another, and
wherein the other switching elements are disposed so that longitudinal directions thereof are inclined with respect to the longitudinal directions of the part of the switching elements.

10. The power tool according to claim 9,
wherein the part of the switching elements are disposed so that the longitudinal directions thereof are aligned substantially on the same line.

11. The power tool according to claim 9,
wherein each of the switching elements includes:
a first terminal that is provided at a bottom surface of the resin casing so as to be coupled to the circuit board; and
a second terminal that extends from a side surface of the resin casing toward the circuit board so as to be coupled to the circuit board.

* * * * *